(12) United States Patent  
Kashihara

(10) Patent No.: US 6,479,856 B1
(45) Date of Patent: Nov. 12, 2002

(54) ELECTRODE AND A CAPACITOR AND DRAM CONTAINING THE SAME

(75) Inventor: Keiichiro Kashihara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/435,214

(22) Filed: Nov. 5, 1999

(30) Foreign Application Priority Data

Jun. 1, 1999 (JP) .......................................... P11-153349

(51) Int. Cl.$^7$ ............................................ H01L 27/108
(52) U.S. Cl. ...................................... 257/310; 257/306
(58) Field of Search ................................ 257/310, 306, 257/412

(56) References Cited

U.S. PATENT DOCUMENTS

| | | | | |
|---|---|---|---|---|
| 3,634,204 A | * | 1/1972 | Dhaka et al. .................. | 204/15 |
| 4,135,998 A | * | 1/1979 | Gniewek et al. ............. | 204/192 |
| 5,164,808 A | * | 11/1992 | Evans, Jr. et al. ............ | 361/305 |
| 6,100,200 A | * | 8/2000 | Van Buskirk et al. ....... | 438/697 |
| 6,278,150 B1 | * | 8/2001 | Okudaira et al. ............. | 257/306 |
| 6,320,213 B1 | * | 11/2001 | Kirlin et al. .................. | 257/295 |

FOREIGN PATENT DOCUMENTS

| | | |
|---|---|---|
| JP | 7-074325 | 3/1995 |
| JP | 10-022469 | 1/1998 |
| JP | 10-079481 | 3/1998 |
| JP | 10-256503 | 9/1998 |

* cited by examiner

Primary Examiner—Steven Loke
Assistant Examiner—Douglas W. Owens
(74) Attorney, Agent, or Firm—Oblon, Spivak, McClelland, Maier & Neustadt, P.C.

(57) ABSTRACT

A Layered product (70) is formed on a high-dielectric-constant layer (64). The layered product has a layered structure consisting of an upper electrode (71), a barrier layer (72), a stopper layer (73) and an adhesion layer (74) in this order from the near side of the high-dielectric-constant layer (64). For the high-dielectric-constant layer (64), the upper electrode (71), the barrier layer (72), the stopper layer (73) and the adhesion layer (74), BST, Pt or PtO$_a$, TiN or TiSiN, PtSi$_x$O$_y$N$_z$ (0<x, y, z<1) and Tin are used, respectively. Since it is possible to reduce a stress on the stopper layer (73), the stress applied to the high-dielectric-constant layer (64) can be suppressed, to prevent deterioration in dielectric characteristics.

19 Claims, 9 Drawing Sheets

ELECTRODE AND A CAPACITOR AND DRAM CONTAINING THE SAME

BACKGROUND OF THE INVENTION

1. Field of the Invention

The present invention relates to an electrode structure of capacitor, and more particularly to an electrode structure of capacitor using materials of high dielectric constant.

2. Description of the Background Art

Studies on dielectric of high dielectric constant have been conventionally made in order to increase capacitance of a capacitor in highly-integrated DRAM. For example, barium strontium titanate $((Ba_bSr_{1-b})TiO3:0<b<1$, hereinafter referred to as "BST") is introduced in Japanese Patent Application Laid Open Gazette No. 10-256503.

FIG. 20 is a cross section showing an exemplary structure of DRAM. In an upper surface of a semiconductor substrate 31, an isolation oxide film 33 and an isolation impurity layer 35 are formed, and in a region of the upper surface of the semiconductor substrate 31 sectioned by these constituents, three impurity layers 25 are formed. The center impurity layer 25 is shared by a pair of MIS transistors 30 and the right and left impurity layers 25 are in contact with contact plugs 26a.

Each MIS transistor 30 has a gate insulating film 21, a gate electrode 23 formed on the gate insulating film 21 and an insulating film 27 covering the gate electrode 23. Between a pair of insulating films 27, a bit line 37 connected to the center impurity layer 25 is provided. The insulating films 27 and the bit line 37 are covered with an interlayer insulating film 24a while the contact plugs 26a penetrate the interlayer insulating film 24a to come into contact with barrier layers 61a. Upper and side surfaces of the barrier layer 61a are covered with lower electrodes 62a and 63a mainly made of platinum, which are further covered with a high-permittivity layer 64 (i.e., dielectric layer with high permittivity) made of BST. The high-permittivity layer 64 is covered with an upper electrode 81 mainly made of platinum, and the upper electrode 81 is further covered with a conductive film 10. The conductive film 10 is covered with an interlayer insulating film 41.

The lower electrodes 62a and 63a, the upper electrode 81 and the high-permittivity layer 64 constitute a capacitor, and one electrode of the capacitor is connected to the bit line 37 through the barrier layer 61a, the contact plug 26a and the transistor 30.

On the other hand, the interlayer insulating film 41 is locally removed, and a layered structure consisting of a barrier layer 42 and an aluminum wire 43 is connected to the conductive layer 10. Therefore, the other electrode of the capacitor is connected to the aluminum wire 43 through the upper electrode 81, the conductive layer 10 and the barrier layer 42.

FIG. 21 is a cross section showing constituents of the conductive layer 10 and connection between the conductive layer 10 and the layered structure of the barrier layer 42 and the aluminum wire 43. The conductive layer 10 has a layered structure consisting of a barrier layer 10a, a stopper layer 10b and an adhesion layer 10c in this order from the near side of the upper electrode 81. In some cases, the barrier layer 42 penetrates the adhesion layer 10c as shown in this figure due to overetching in anisotropic etching on the interlayer insulating film 41 to provide a trench for placing the aluminum wire 43. The barrier layer 10a is made of, e.g., TiN to suppress a reaction in a heat treatment on the aluminum wire 43 and the upper electrode 81. Further, the stopper layer 10b is made of PtSi since it works as a sacrifice reacting film when the aluminum wire 43 and the upper electrode 81 are reacted in the heat treatment. The stopper layer 10b also works to suppress the overetching when the interlayer insulating film 41 is anisotropically etched to provide a trench for placing the aluminum wire 43. The adhesion layer 10c is formed to improve adhesion between the conductive film 10 and the interlayer insulating film 41 and, for example, made of TiN when the interlayer insulating film 41 is a silicon oxide. The structure of FIG. 21 is shown, for example, in Japanese Patent Application Laid Open Gazette No. 10-256503.

In the above structure, however, the capability of the barrier layer 10a as a barrier is not perfect, and a reaction may be caused between the PtSi of the stopper layer 10b and Pt of the upper electrode 81. With such a reaction, the BST may be reduced in an interface between the upper electrode 81 and the high-permittivity layer 64. Further, depositing the conductive film 10 and the upper electrode 81 thereon puts a stress on the high-permittivity layer 64.

SUMMARY OF THE INVENTION

The present invention is directed to an electrode structure of capacitor. According to a first aspect of the present invention, the electrode structure of capacitor has a first electrode layer; and a second electrode layer including platinum, silicon and at least one of oxygen and nitrogen, in this order from the side in contact with a dielectric layer of the capacitor.

Preferably, the second electrode layer has a higher composition ratio of at least one of oxygen and nitrogen on the near side from the first electrode layer than on the far side thereof.

According to a second aspect of the present invention, in the electrode structure of the first aspect, the second electrode layer has a double-layered structure, consisting of a third electrode layer located on the near side of the first electrode layer and a fourth electrode layer located on the far side thereof, and the third electrode layer has a higher composition ratio of at least one of oxygen and nitrogen than the fourth electrode layer.

According to a third aspect of the present invention, in the electrode structure of the second aspect, the fourth electrode layer also works as an adhesion layer.

According to a fourth aspect of the present invention, in the electrode structure of any one of the first to third aspects, platinum oxide is used for the first electrode layer.

Preferably, the dielectric layer is made of dielectric oxide.

The present invention is also directed to a capacitor. According to a fifth aspect of the present invention, the capacitor comprises: a dielectric layer; a first electrode layer formed on the dielectric layer; and a second electrode layer formed on the first electrode layer, including platinum, silicon and at least one of oxygen and nitrogen.

Preferably, the second electrode layer has a higher composition ratio of at least one of oxygen and nitrogen on the near side from the first electrode layer than on the far side thereof.

According to a sixth aspect of the present invention, in the capacitor of the fifth aspect, the second electrode layer has a double-layered structure, consisting of a third electrode layer located on the near side of the first electrode layer and a fourth electrode layer located on the far side thereof, and the third electrode layer has a higher composition ratio of at least one of oxygen and nitrogen than the fourth electrode layer.

According to a seventh aspect of the present invention, in the capacitor of the sixth aspect, the fourth electrode layer also works as an adhesion layer.

According to an eighth aspect of the present invention, in the capacitor of any one of the fifth to seventh aspects, platinum oxide is used for the first electrode layer.

Preferably, the dielectric layer is made of dielectric oxide.

The present invention is further directed to a DRAM. According to a ninth aspect of the present invention, the DRAM comprises: a capacitor having a dielectric layer, a first electrode layer formed on the dielectric layer, and a second electrode layer formed on the first electrode layer, including platinum, silicon and at least one of oxygen and nitrogen.

Preferably, the second electrode layer has a higher composition ratio of at least one of oxygen and nitrogen on the near side from the first electrode layer than on the far side thereof.

According to a tenth aspect of the present invention, in the DRAM of the ninth aspect, the second electrode layer has a double-layered structure, consisting of a third electrode layer located on the near side of the first electrode layer and a fourth electrode layer located on the far side thereof, and the third electrode layer has a higher composition ratio of at least one of oxygen and nitrogen than the fourth electrode layer.

According to an eleventh aspect of the present invention, in the DRAM of tenth aspect, the fourth electrode layer also works as an adhesion layer.

According to a twelfth aspect of the present invention, in the DRAM of any one of the ninth to eleventh aspects, platinum oxide is used for the first electrode layer.

Preferably, the dielectric layer is made of dielectric oxide.

In the electrode structure of capacitor of the first aspect, since the second electrode layer relieves a stress on the dielectric layer, the dielectric characteristics of the dialectic layer can be improved.

In the electrode structure of capacitor of the second aspect, the third electrode layer and the fourth electrode layer each working as a barrier layer can be consecutively formed by sputtering using one target and one chamber.

In the electrode structure of capacitor of the third aspect, since the second electrode layer also works as an adhesion layer, no adhesion layer has to be provided.

In the electrode structure of capacitor of the fourth aspect, since reduction on the dielectric layer is prevented, it is possible to suppress deterioration of the dielectric layer even if an oxide is used for the dielectric layer.

In the capacitor of the fifth aspect, since the second electrode layer relieves a stress on the dielectric layer, the dielectric characteristics of the dialectic layer can be improved.

In the capacitor of the sixth aspect, the third electrode layer and the fourth electrode layer each working as a barrier layer can be consecutively formed by sputtering using one target and one chamber.

In the capacitor of the seventh aspect, since the second electrode layer also works as an adhesion layer, no adhesion layer has to be provided.

In the capacitor of the eighth aspect, since reduction on the dielectric layer is prevented, it is possible to suppress deterioration of the dielectric layer even if an oxide is used for the dielectric layer.

In the DRAM of the ninth aspect, since the second electrode layer relieves a stress on the dielectric layer, the dielectric characteristics of the dialectic layer can be improved.

In the DRAM of the tenth aspect, the third electrode layer and the fourth electrode layer each working as a barrier layer can be consecutively formed by sputtering using one target and one chamber.

In the DRAM of the eleventh aspect, since the second electrode layer also works as an adhesion layer, no adhesion layer has to be provided.

In the DRAM of the twelfth aspect, since reduction on the dielectric layer is prevented, it is possible to suppress deterioration of the dielectric layer even if an oxide is used for the dielectric layer.

With the above reduction and application of stress, there is a possibility of deteriorating the dielectric characteristics of the high-permittivity layer 64. An object of the present invention is to provide an electrode structure of capacitor to reduce the possibility and improve the dielectric characteristics of the high-permittivity layer 64.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
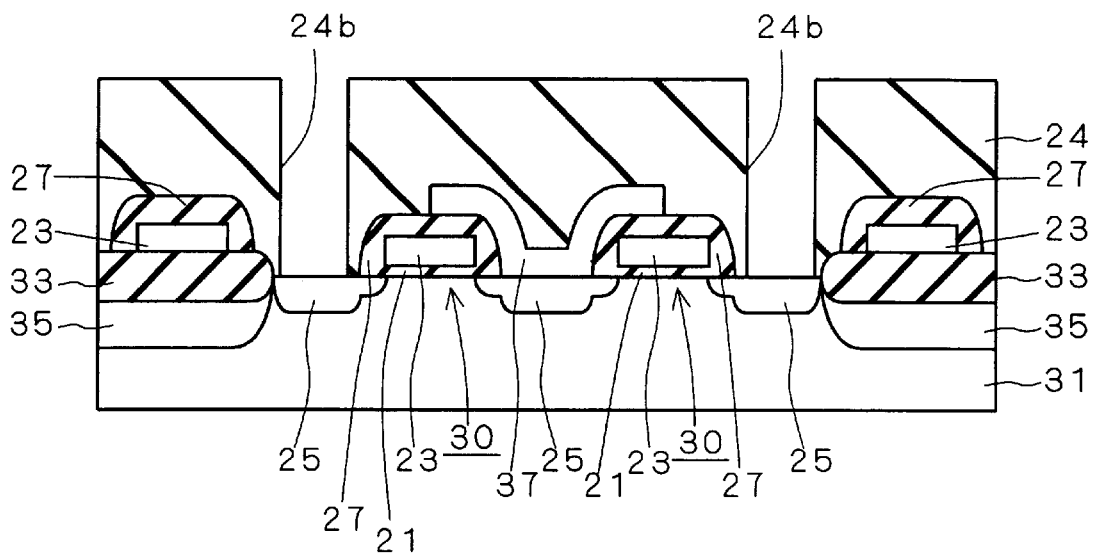
FIGS. 1 to 12 are cross sections showing a process of manufacturing a DRAM using an electrode structure in accordance with the present invention step by step.

A. An Example of Semiconductor Device that the Present Invention Is Applicable to Prior to detailed discussion on an electrode structure of capacitor in accordance with the present invention, an example of semiconductor device using a capacitor with this electrode structure will be discussed below.

FIGS. 1 to 12 are cross sections showing a process of manufacturing a DRAM with a capacitor using an electrode structure in accordance with the present invention as an upper electrode step by step.

In the upper surface of the semiconductor substrate 31 mainly made of e.g., silicon, the isolation oxide film 33 is selectively formed. Below the isolation oxide film 33, the isolation impurity layer 35 is formed. In a region sectioned by the isolation oxide film 33 and the isolation impurity layer 35, a pair of MIS transistors 30 are formed.

The pair of MIS transistors 30 share the center one of three impurity layers 25 formed in the upper surface of the semiconductor device 31 while having the left and right ones of the impurity layers 25, respectively, as a pair of impurity layers with respect to the center impurity layer 25. Each MIS transistor 30 has the gate insulating film 21, the gate electrode 23 formed on the gate insulating film 21 and the insulating film 27 covering the gate electrode 23.

The bit line 37 connected to the center impurity layer 25 is formed between the pair of insulating films 27, and the MIS transistors 30 and the bit line 37 are covered with the interlayer insulating film 24. The interlayer insulating film 24 is made of e.g., a silicon oxide. Portions in the interlayer insulating film 24 above the left and right impurity layers 25, through holes 24b are selectively provided, to achieve a structure of FIG. 1.

Figure 2:
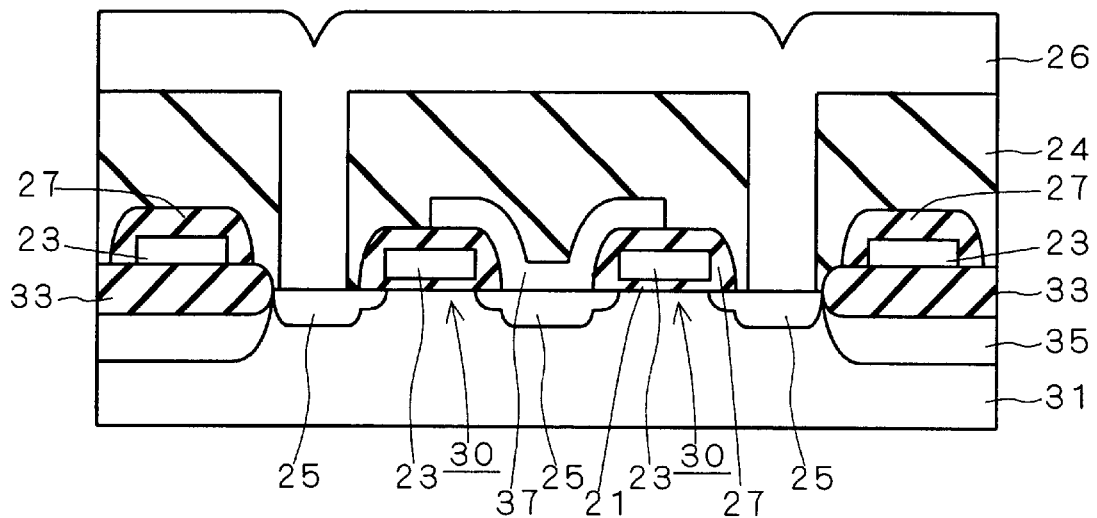
Figure 3:
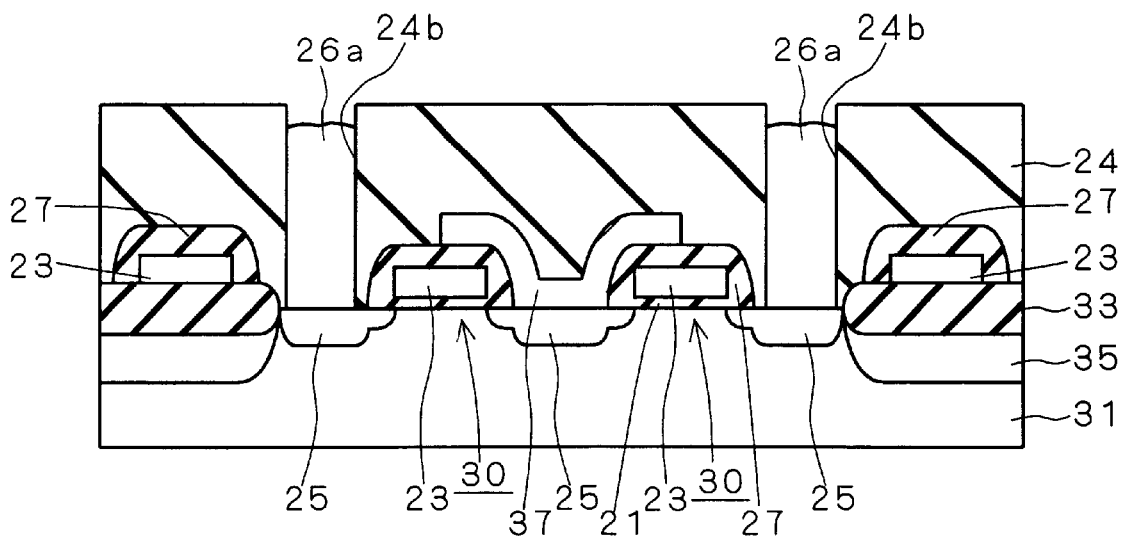
Figure 4:
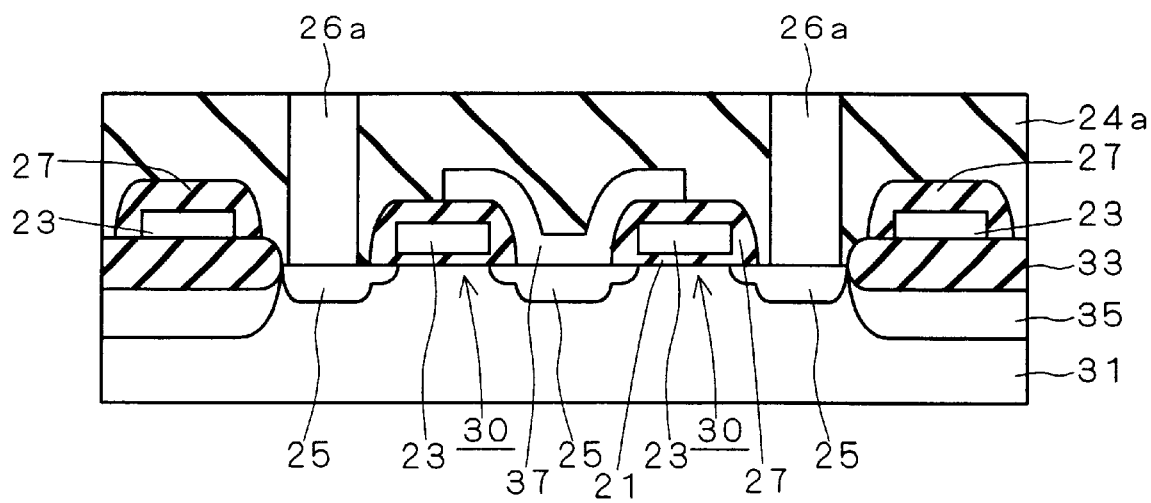
Figure 5:
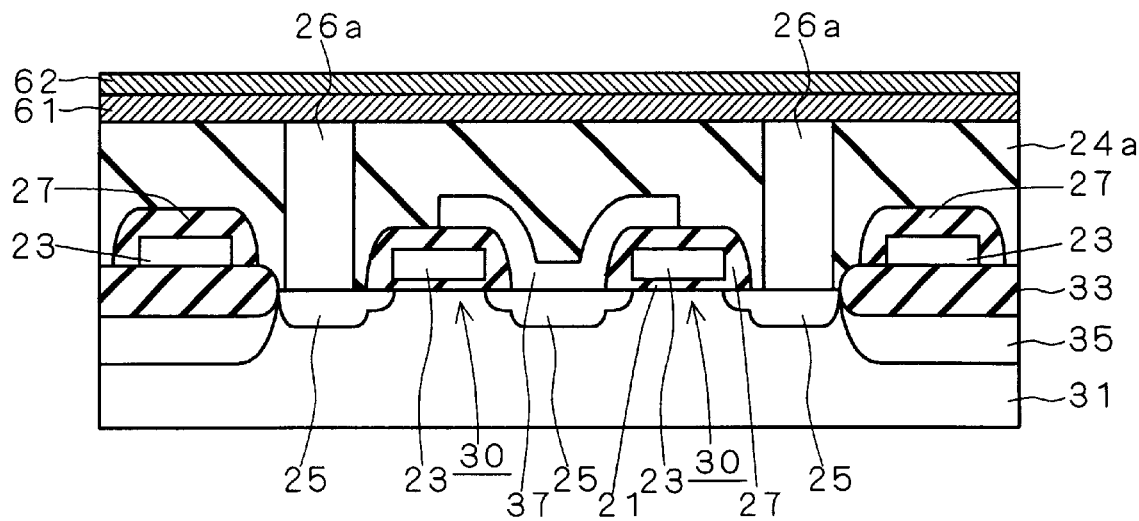

A doped polysilicon 26 is deposited entirely on the structure of FIG. 1, to achieve a structure of FIG. 2. The polysilicon 26 is anisotropically etched to expose an upper surface of the interlayer insulating film 24. As a result, the contact plug 26a which is left, being buried, in the through hole 24b is obtained, as shown in FIG. 3. After that, a chemical mechanical polishing (CMP) is performed from the upper surface side of the interlayer insulating film 24 to nearly even the upper surface of the interlayer insulating film 24a and an upper surface of the contact plug 26a, to achieve a structure of FIG. 4. A TiN layer 61 and a platinum layer 62 are thereafter deposited in this order, to achieve a structure of FIG. 5. Portions of the layers 61 and 62 which cover the contact plug 26a with margins are left, to form the barrier layer 61a and the lower electrode 62a, achieving a structure of FIG. 6.

Figure 6:
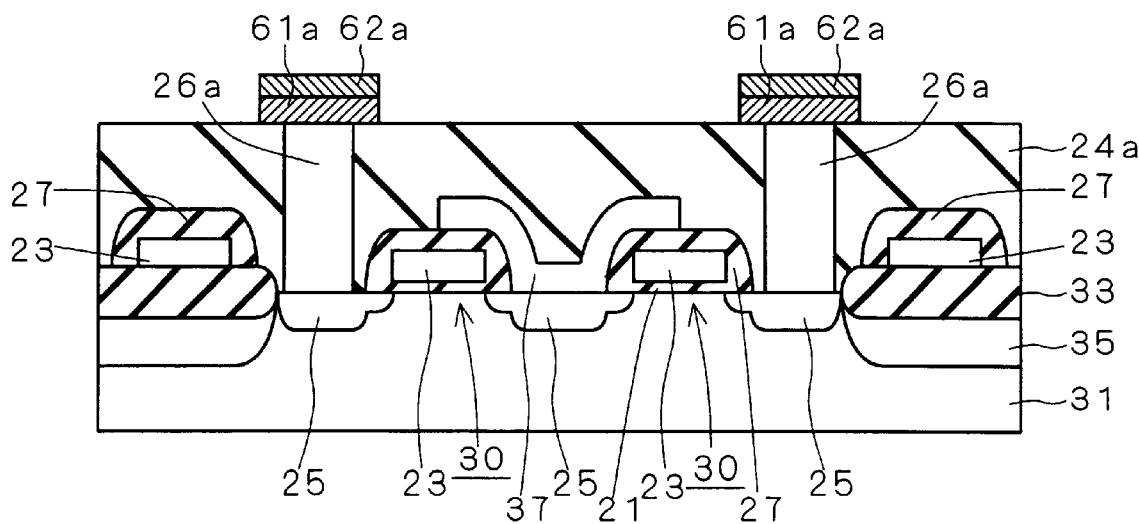
Figure 7:
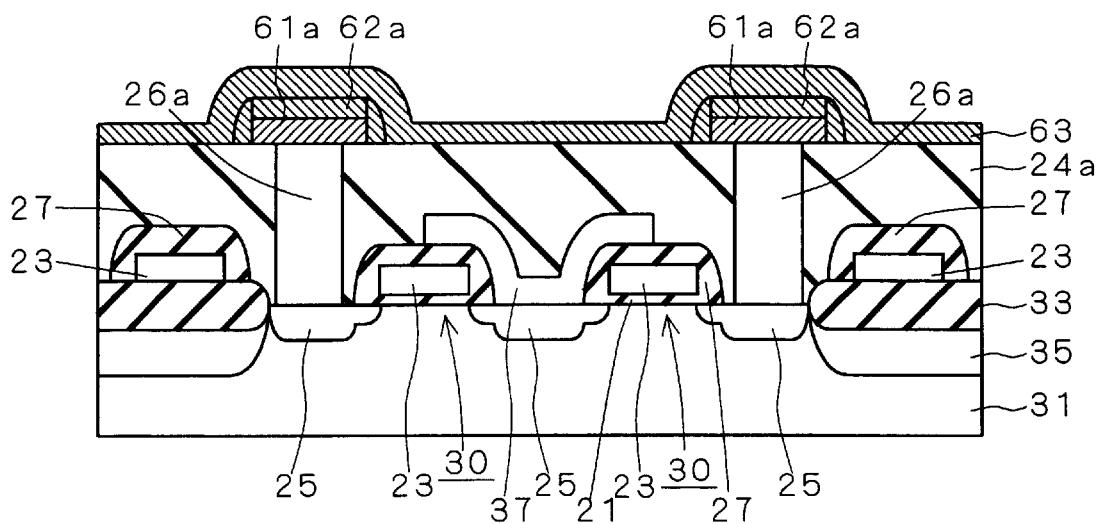
Figure 8:
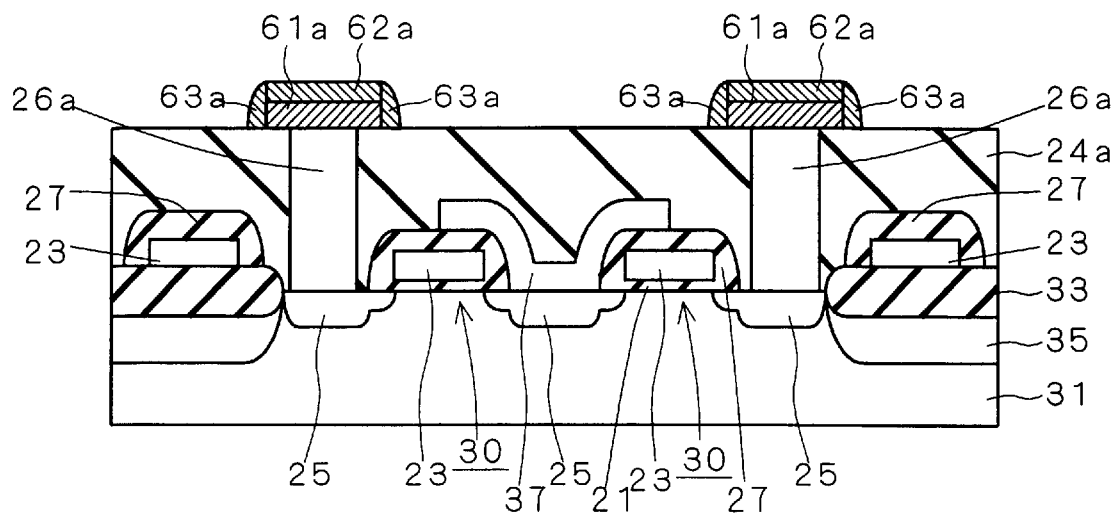
Figure 9:
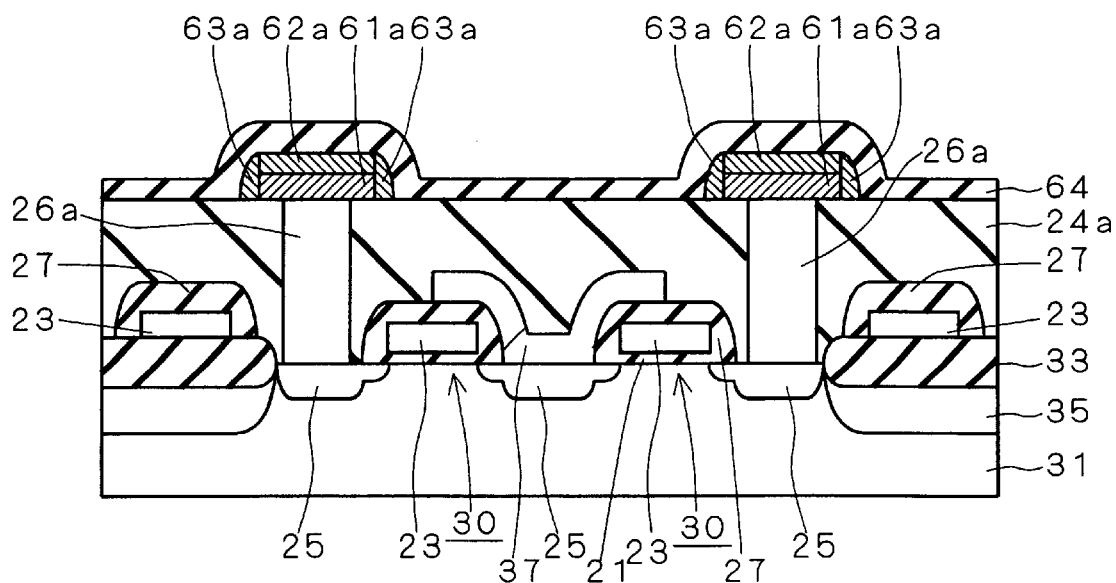

Further, a platinum layer 63 is deposited entirely on the structure of FIG. 6, to achieve a structure of FIG. 7, and then the platinum layer 63 is anisotropically etched so as to leave the platinum layer 63 only on side walls of the barrier layer 61a to form the lower electrode 63a, achieving a structure of FIG. 8. The high-permittivity layer 64 is entirely deposited, to achieve a structure of FIG. 9, and then a layered product 70 discussed later in detail is further deposited, to achieve a structure of FIG. 10. The high-permittivity layer 64 and the layered product 70 are patterned as design requires, and a shape of patterning is not shown in this cross section.

Figure 10:
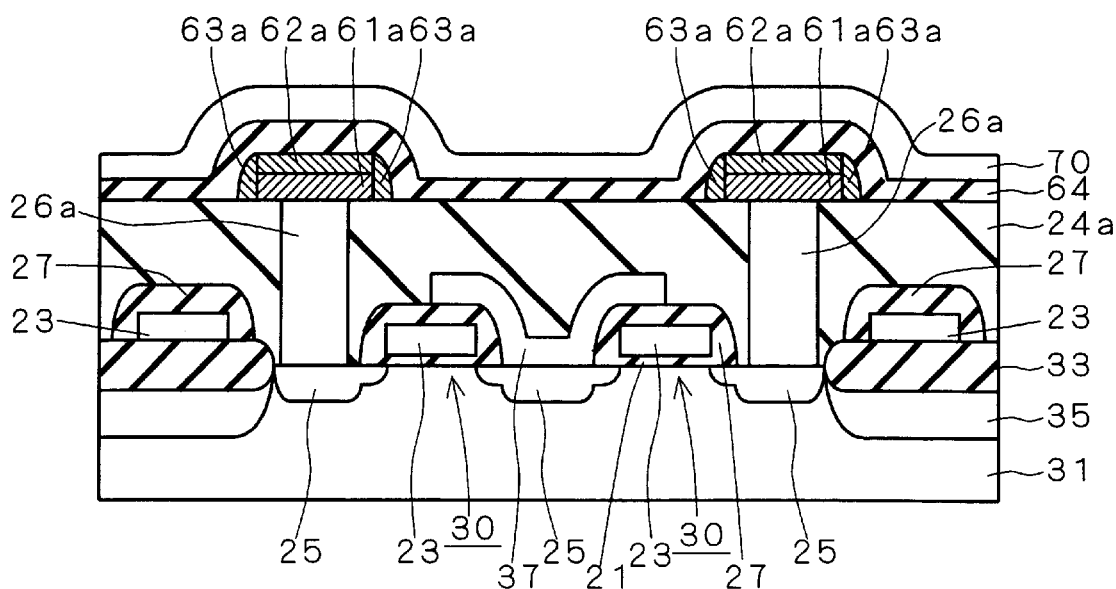
Figure 11:
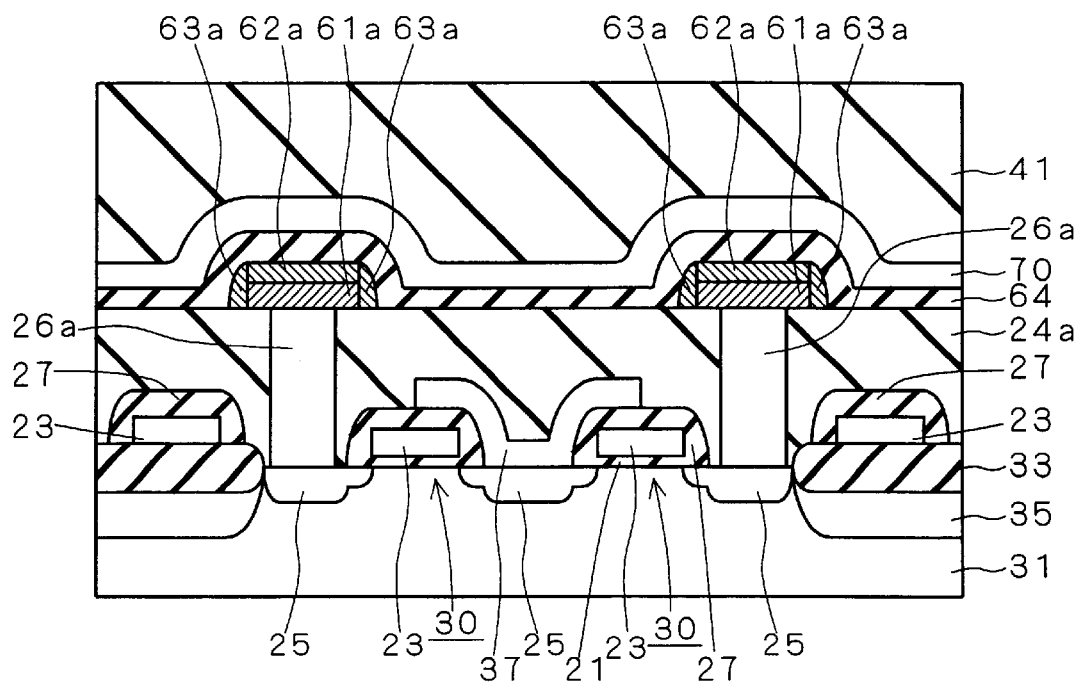
Figure 12:
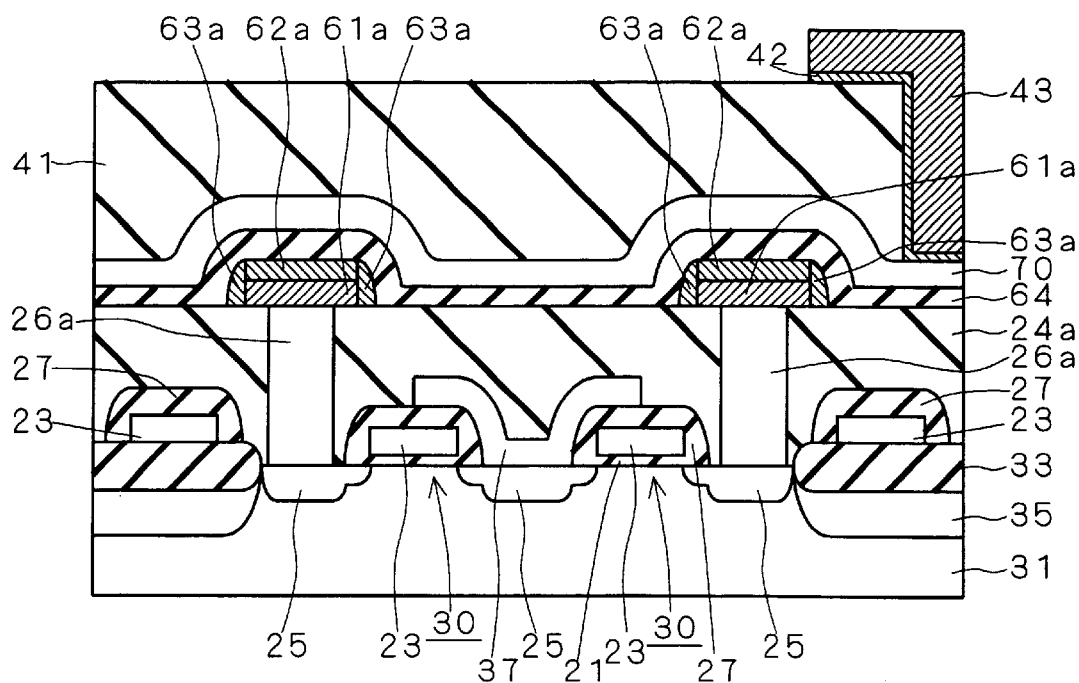

The interlayer insulating film 41 made of e.g., a silicon oxide is deposited entirely on the structure of FIG. 10, to achieve a structure of FIG. 11. After that, a through hole is provided away from above the contact plug 26a in the interlayer insulating film 41 and the through hole is filled with the barrier layer 42 and the aluminum wire 43, to achieve a structure of FIG. 12.

B. The Preferred Embodiments (b-1) The First Preferred Embodiment

Figure 13:
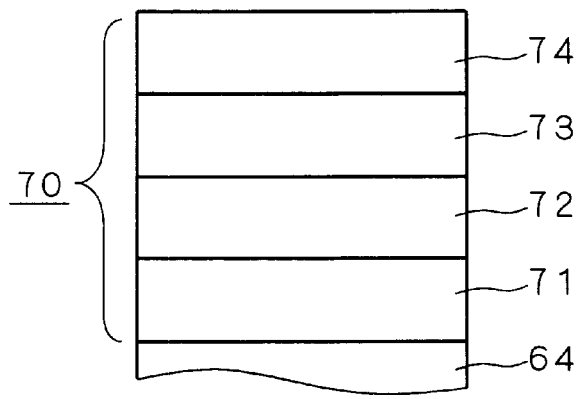
FIG. 13 is a cross section showing a structure in accordance with a first preferred embodiment of the present invention.

FIG. 13 is a cross section showing an electrode structure of capacitor in accordance with the first preferred embodiment of the present invention. On the high-permittivity layer 64 serving as a dielectric of capacitor formed is the layered product 70 consisting of an upper electrode 71, a barrier layer 72, a stopper layer 73 and an adhesion layer 74 which are layered in this order from the near side of the high-permittivity layer 64.

Platinum (Pt) is used for the upper electrode 71. TiN is used for the barrier layer 72, like the barrier layer 10a or TiSiN may be. TiN is used for the adhesion layer 74, like the adhesion layer 10c. $PtSi_xO_yN_z$ is used for the stopper layer 73, unlike the stopper layer 10b.

Thus, by using $PtSi_xO_yN_z$ in which oxygen and nitrogen are added to the material of the stopper layer 10b for the stepper layer 73, the dielectric characteristics of the high-permittivity layer 64 is improved. For example, the stopper layer 73 is formed by sputtering using a target made of $PtSi_x$ ($0.5 \leq x \leq 1.0$) and $Ar/O_2/N_2$ gas. More specifically, sputtering is performed at a substrate temperature of 200 to 400° C., with the flow of Ar gas at 25 to 100 sccm (desirably, 55 sccm), the flow of $O_2$ gas at 1.5 sccm or less (desirably, 1.0 sccm) and the flow $N_2$ gas at 5 sccm or less (desirably, 1.0 sccm), at a sputtering pressure of 0.2 to 1.0 Pa (desirably, 0.4 Pa) and RF power of 300 to 1000 W (desirably, 500 W), to deposit a layer having a film thickness of 300 to 1000 Å (desirably, 500 Å) as the stopper layer 73.

Though it is uncertain in detail why the dielectric characteristics of the high-dielectric-adhesion layer 64 is improved, it is thought that the stopper layer 73 can relieve the stress that is applied to the high-permittivity layer 64. To relieve the stress, it is not necessary to apply both oxygen and nitrogen to the material of the stopper layer 10b but it is necessary to apply only oxygen thereto. Therefore, as to the above sputtering condition, the flow of $N_2$ gas may be 0.

For example, a film formed by sputtering with $O_2$ gas mixed into Ar gas allows arbitrary control of change from tensile stress to compressive stress. Table 1 shows warp of silicon wafer in a case where a TiSiN film of 100 Å is formed on the silicon wafer and then a PtSiO film is formed as above discussed to have a thickness of 7000 to 9000 Å. Table 1 shows the amount of warp with respect to the flow of Ar gas and $O_2$ gas.

TABLE 1

| Flow of $Ar/O_2$ gas | Amount of Warp as depo. | Amount of Warp after Sintering |
| --- | --- | --- |
| 55.0/0.0 sccm | −22.0, −20.0 μm | −27.5, −25.0 μm |
| 54.0/1.0 sccm | −29.0, −30.5 μm | −28.0, −32.0 μm |
| 53.8/1.2 sccm | −11.5, −17.5 μm | −12.5, −16.5 μm |
| 53.6/1.4 sccm | +9.0, +8.5 μm | +5.0, +5.0 μm |
| 53.4/1.6 sccm | +29.0, +29.5 μm | +12.0, +12.5 μm |

In Table 1, the column with "as depo" gives the amount of warp in a case where only PtSiO film is formed while the column with "after sintering" gives that in a case where a sintering is performed after forming the PtSiO film. The sintering is performed in a nitrogen atmosphere, at a temperature of 450° C. for thirty minutes. Two values separated by a comma in each column represent the amounts of warp in two directions orthogonal to each other. A warp in a direction of film formation is represented by a value with positive sign and that in the opposite direction is represented by a value with negative sign. The positive and negative signs indicate the tensile stress and the compressive stress which are applied to the PtSiO film, respectively. In Table 1, it is shown that the ratios of the flow of $O_2$ gas mixed into Ar gas are 0, 1.9, 2.2, 2.6 and 3.0% in this order from upper side.

After sintering, the tensile stress increases (the compressive stress decreases), and when the ratio of the flow of $O_2$ gas mixed into Ar gas is 1.9 or 2.2%, the amount of change (increase or decrease) before and after the sintering is minimum. Therefore, it is found desirable that the stopper layer 73 is formed under a condition that the ratio of the flow of $O_2$ gas mixed into Ar gas is about 2% when $N_2$ gas is not mixed.

There is the same tendency in a case where the PtSiN film is used for the stopper layer 73, and in the above condition, the flow of $O_2$ gas may be also 0. After all, to relieve the stress, it is not necessary to apply both oxygen and nitrogen to the material of the stopper layer 10b but it is only necessary to apply either of them thereto.

Further, the upper electrode 81 is formed by e.g., DC or RF sputtering. More specifically, the sputtering is performed using Pt target and Ar gas, at a substrate temperature of 200 to 400° C., at a pressure of 1 to 10 mTorr, to deposit a layer having a film thickness of 300 to 1000 Å (desirably, 500 Å).

The adhesion layer 74 is formed by DC sputtering. More specifically, the DC sputtering is performed using Ti target with $N_2$ gas mixed into Ar gas, to deposit a layer having a film thickness of 50 to 100 Å (desirably, 75 Å).

The barrier layer 72 may be formed like the adhesion layer 74, or may be formed using TiSiN. The film thickness thereof is set at e.g., 100 Å.

The high-permittivity layer 64 is formed by sputtering with RF or RF and DC superimposed thereon. More specifically, the sputtering is performed using ceramic target of $(Ba_bSr_{1-b})TiO_3$ ($0.3 \leq b \leq 0.5$) or ceramic reduction target and Ar gas or Ar gas with $O_2$ or $N_2O$ gas mixed therein, at a pressure of 0.1 to 1.0 Pa, at a substrate temperature of 200 to 550° C., to deposit a layer having a film thickness of 300 to 1000 Å (desirably, 600 Å).

Further, like in the background art, the interlayer insulating film 41 and the aluminum wire 43 may reach the stopper layer 73 due to overetching in an anisotropic etching to provide a through hole in the interlayer insulating film 41.

(b-2) The Second Preferred Embodiment

Figure 14:
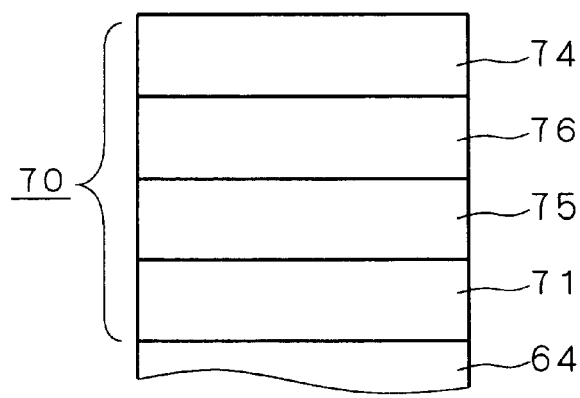
FIG. 14 is a cross section showing a structure in accordance with a second preferred embodiment of the present invention.

FIG. 14 is a cross section showing an electrode structure of capacitor in accordance with the second preferred embodiment of the present invention. On the high-permittivity layer 64 serving as a dielectric of a capacitor formed is the layered product 70 having a layered structure consisting of the upper electrode 71, a $PtSi_xO_yN_z$ layer 75, a $PtSi_xO_vN_w$ layer 76 ($0 < v, w < 1$) and the adhesion layer 74 in this order from the near side of the high-permittivity layer 64.

In compositions of the $PtSi_xO_yN_z$ layer 75 and the $PtSi_xO_vN_w$ layer 76, at least one of $y > v$ and $z > w$ is true. For example, the $PtSi_xO_yN_z$ layer 75 has a film thickness of 100 Å and the $PtSi_xO_vN_w$ 76 has a film thickness of 300 to 1000 Å (desirably, 500 Å).

According to the present invention, since the $PtSi_xO_yN_z$ layer 75 includes oxygen and nitrogen, this layer has a capability as a barrier, and since the $PtSi_xO_vN_w$ layer 76 working as a stopper layer can be formed contiguously to the $PtSi_xO_yN_z$ layer 75 using the same target and chamber, its manufacturing process becomes simpler. Specifically, under the condition of the stopper layer 73 discussed in the first preferred embodiment, changing the flows of $O_2$ gas and $N_2$ gas allows the $PtSi_xO_vN_w$ layer 76 and $PtSi_xO_yN_z$ layer 75 to be formed contiguously.

Figure 15:
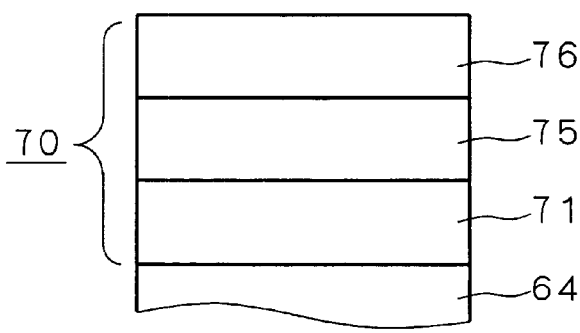
FIG. 15 is a cross section showing a variation of the structure in accordance with the second preferred embodiment of the present invention.

FIG. 15 is a cross section showing a variation of the electrode structure of capacitor in accordance with the second preferred embodiment of the present invention. As compared with the structure of FIG. 14, the adhesion layer 74 is omitted in the layered product 70, for the $PtSi_xO_vN_w$ layer 76 can obtain adhesion with the interlayer insulating film 41 by controlling its composition.

Figure 16:
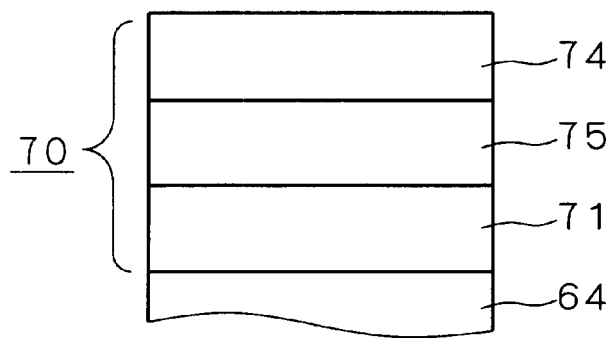
FIG. 16 is a cross section showing another variation of the structure in accordance with the second preferred embodiment of the present invention.
Figure 17:
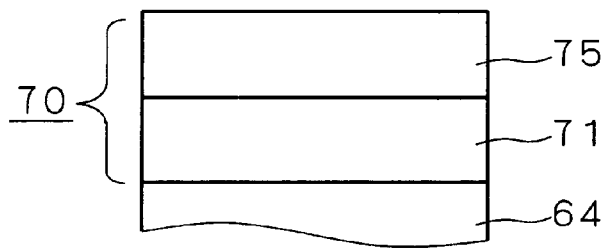
FIG. 17 is a cross section showing still another variation of the structure in accordance with the second preferred embodiment of the present invention.

FIG. 16 is a cross section showing another variation of the structure in accordance with the second preferred embodiment of the present invention. As compared with the structure of FIG. 14, the $PtSi_xO_vN_w$ layer 76 is omitted in the layered product 70, for the $PtSi_xO_yN_z$ layer 75 can obtain both functions of a barrier layer and a stopper layer by controlling its composition. Also in this variation, the adhesion layer 74 can be omitted if the adhesion with the interlayer insulating film 41 can be obtained. The structure of the layered product 70 in this case is shown in a cross section of FIG. 17.

Further, in the structures shown in FIGS. 14 to 17, like in the background art, the interlayer insulating film 41 and the aluminum wire 43 may reach the $PtSi_xO_yN_z$ layer 75 due to overetching in an anisotropic etching to provide a through hole in the interlayer insulating film 41.

(b-3) The Third Preferred Embodiment

Figure 18:
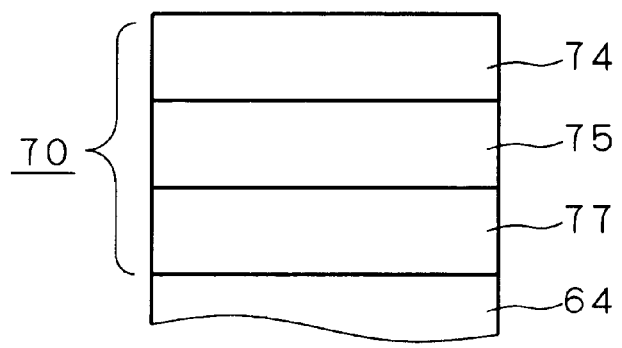
FIG. 18 is a cross section showing a structure in accordance with a third preferred embodiment of the present invention.

FIG. 18 is a cross section showing an electrode structure of capacitor in accordance with the third preferred embodiment of the present invention. On the high-permittivity layer 64 serving as a dielectric of a capacitor formed is the layered product 70 having a layered structure consisting of an upper electrode 77, the $PtSi_xO_yN_z$ layer 75 and the adhesion layer 74 in this order from the near side of the high-permittivity layer 64. The upper electrode 77 is formed of $PtO_a$ ($0 < a < 1$) by DC or RF sputtering. More specifically, the sputtering is performed using Pt target with $O_2$ gas of 1% or less mixed into Ar gas, at a substrate temperature of 200 to 400° C., at a pressure of 1 to 10 mTorr, to deposit a layer having a film thickness of 300 to 1000 Å (desirably, 500 Å).

Since the upper electrode 77 made of $PtO_a$ prevents reduction on the high-permittivity layer 64 caused by the steps after formation of the capacitor, such as formation of plasma SiN, sintering in a hydrogen atmosphere, formation of plasma TEOS and plasma SiO serving as interlayer films, it is possible to avoid deterioration in dialectic characteristics of the high-permittivity layer 64.

Further, it is desirable to use $PtO_a$ for the upper electrode 71 in the first and second preferred embodiments since an effect of preventing reduction on the high-permittivity layer 64 is added. In other words, when an oxide is used for the high-permittivity layer 64, it is possible to suppress deterioration of its characteristics.

Figure 19:
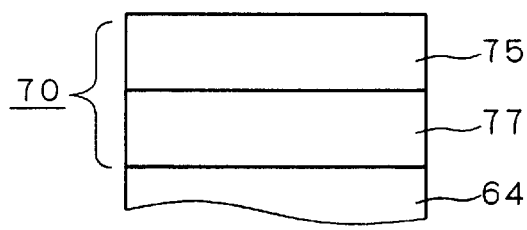
FIG. 19 is a cross section showing a variation of the structure in accordance with the third preferred embodiment of the present invention.
Figure 20:
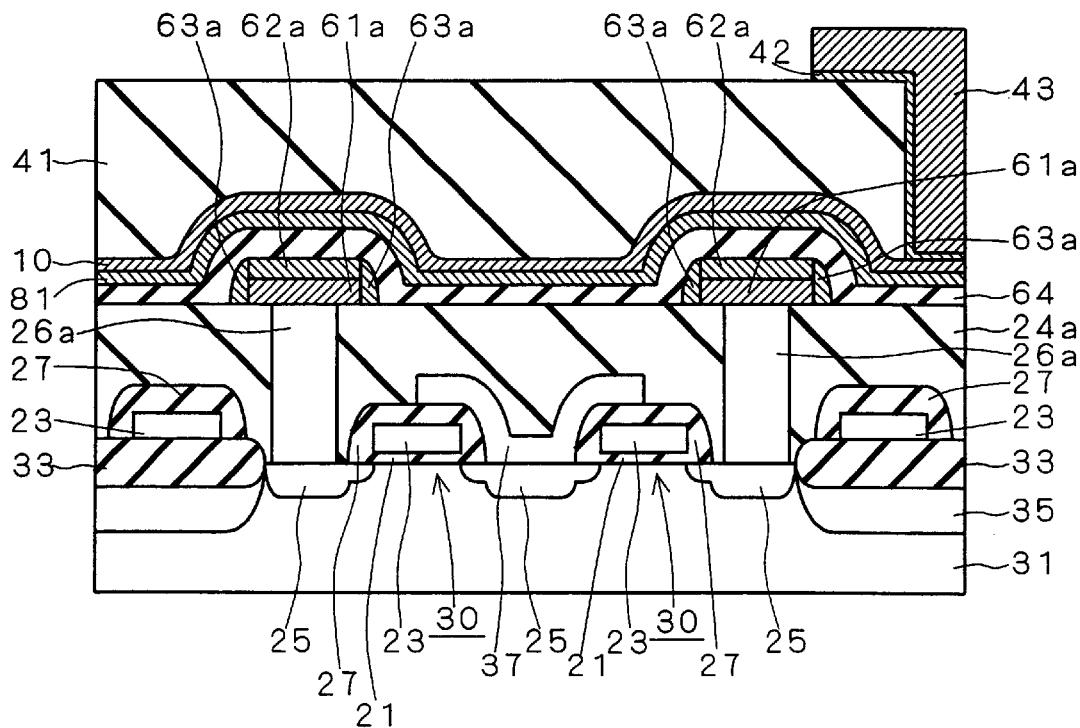
FIGS. 20 and 21 are cross sections showing an exemplary technique in the background art.
Figure 21:
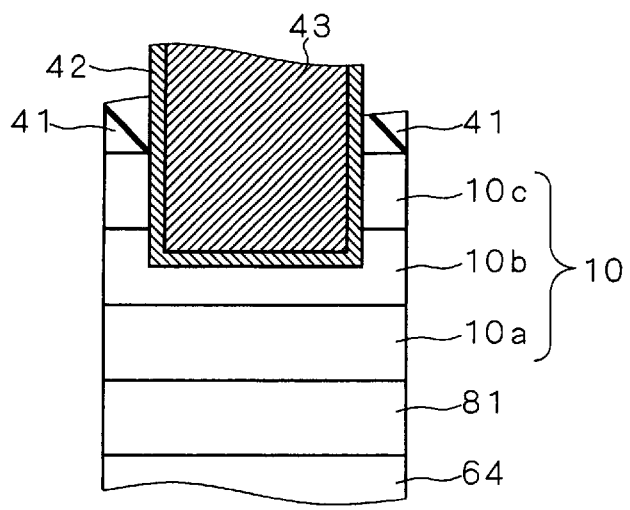

Also in this preferred embodiment, the adhesion layer 74 can be omitted if the adhesion with the interlayer insulating film 41 can be obtained. The structure of the layered product 70 in this case is shown in a cross section of FIG. 19.

While the invention has been shown and described in detail, the foregoing description is in all aspects illustrative and not restrictive. It is therefore understood that numerous modifications and variations can be devised without departing from the scope of the invention.

What is claimed is:

1. An electrode structure of capacitor, having a first electrode layer; and a second electrode layer including platinum, silicon and at least one of oxygen and nitrogen, in this order from the side in contact with a dielectric layer of said capacitor, wherein
    said second electrode layer has a higher composition ratio of at least one of oxygen and nitrogen on the near side from said first electrode layer than on the far side thereof.

2. The electrode structure according to claim 1, wherein said second electrode layer contains two layers, in which a first layer is located on the near side of said first electrode layer and a second layer is located on the far side thereof, and said first layer has a higher composition ratio of at least one of oxygen and nitrogen than said second layer.

3. The electrode structure according to claim 2, wherein said second layer also works as an adhesion layer.

4. A capacitor, comprising:

a dielectric layer;

a first electrode layer formed on said dielectric layer; and a second electrode layer formed on said first electrode layer, including platinum, silicon and at least one of oxygen and nitrogen, wherein said second electrode layer has a higher composition ratio of at least one of oxygen and nitrogen on the near side from said first electrode layer than on the far side thereof.

5. The capacitor according to claim 4, wherein said second electrode layer contains two layers, in which a first layer is located on the near side of said first electrode layer and a second layer is located on the far side thereof, and said first layer has a higher composition ratio of at least one of oxygen and nitrogen than said second layer.

6. The capacitor according to claim 5, wherein said second layer also works as an adhesion layer.

7. A DRAM comprising:

a capacitor having a dielectric layer, a first electrode layer formed on said dielectric layer, and a second electrode layer formed on said first electrode layer, including platinum, silicon and at least one of oxygen and nitrogen, wherein said second electrode layer has a higher composition ratio of at least one of oxygen and nitrogen on the near side from said first electrode layer than on the far side thereof.

8. The DRAM according to claim 7, wherein said second electrode layer contains two layers, in which a first layer is located on the near side of said first electrode layer and a second layer is located on the far side thereof, and said first layer has a higher composition ratio of at least one of oxygen and nitrogen than said second layer.

9. The DRAM according to claim 8, wherein said second layer also works as an adhesion layer.

10. An electrode structure comprising:

a first electrode layer; and a second electrode layer comprising platinum, silicon, and oxygen, wherein said second electrode layer has a higher composition ratio of oxygen on the near side from said first electrode layer than on the far side thereof, and wherein said second electrode layer contains two layers, in which a first layer is located on the near side of said first electrode layer and a second layer is located on the far side thereof, and said first layer has a higher composition ratio of oxygen than said second layer.

11. The electrode structure according to claim 10, wherein said second layer also works as an adhesion layer.

12. An electrode structure comprising:

a first electrode layer; and a second electrode layer comprising platinum, silicon, oxygen and nitrogen.

13. The electrode structure according to claim 12, wherein said second electrode layer has a higher composition ratio of oxygen and nitrogen on the near side from said first electrode layer than on the far side thereof.

14. The electrode structure according to claim 13, wherein said second electrode layer contains two layers, in which a first layer is located on the near side of said first electrode layer and a second layer is located on the far side thereof, and said first layer has a higher composition ratio of oxygen and nitrogen than said second layer.

15. The electrode structure according to claim 14, wherein said second layer also works as an adhesion layer.

16. The electrode structure according to claim 12, wherein platinum oxide is used for said first electrode layer.

17. An electrode structure comprising:

a first electrode layer; and a second electrode layer comprising platinum, silicon and oxygen, wherein said second electrode layer has a-higher composition ratio of oxygen on the near side from said first electrode layer than on the far side thereof.

18. An electrode structure comprising:

a first electrode layer; and a second electrode layer comprising platinum, silicon, and oxygen, wherein said second electrode layer has a higher composition ratio of oxygen on the near side from said first electrode layer than on the far side thereof, and wherein said second electrode layer contains two layers, in which a first layer is located on the near side of said first electrode layer and a second layer is located on the far side thereof, and said first layer has a higher composition ratio of oxygen than said second layer.

19. An electrode structure comprising:

a first electrode layer; and a second electrode layer comprising platinum, silicon, and oxygen, wherein said second electrode layer has a higher composition ratio of oxygen on the near side from said first electrode layer than on the far side thereof, wherein said second electrode layer contains two layers, in which a first layer is located on the near side of said first electrode layer and a second layer is located on the far side thereof, and said first layer has a higher composition ratio of oxygen than said second layer, and wherein said second layer also works as an adhesion layer.

* * * * *